US012612700B2

(12) United States Patent
Lin et al.

(10) Patent No.: US 12,612,700 B2
(45) Date of Patent: Apr. 28, 2026

(54) ARTICLES COATED WITH A FLUORO-ANNEALED FILM

(71) Applicant: ENTEGRIS, INC., Billerica, MA (US)

(72) Inventors: I-Kuan Lin, Lexington, MA (US); Carlo Waldfried, Middleton, MA (US); Jianan Hou, Lexington, MA (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 18/745,963

(22) Filed: Jun. 17, 2024

(65) Prior Publication Data

US 2024/0337023 A1 Oct. 10, 2024

Related U.S. Application Data

(63) Continuation of application No. 15/871,425, filed on Jan. 15, 2018, now abandoned.

(60) Provisional application No. 62/446,715, filed on Jan. 16, 2017.

(51) Int. Cl.
| | |
|---|---|
| *C23C 16/56* | (2006.01) |
| *C23C 16/40* | (2006.01) |
| *C23C 16/44* | (2006.01) |
| *C23C 16/455* | (2006.01) |

(52) U.S. Cl.
CPC ............ *C23C 16/56* (2013.01); *C23C 16/405* (2013.01); *C23C 16/4404* (2013.01); *C23C 16/45525* (2013.01)

(58) Field of Classification Search
CPC .. C23C 16/56; C23C 16/45525; C23C 16/405
USPC ........................................................ 428/336
See application file for complete search history.

(56) References Cited

U.S. PATENT DOCUMENTS

| | | | | |
|---|---|---|---|---|
| 2009/0269941 A1* | 10/2009 | Raisanen | .......... | C23C 16/45536 |
| | | | | 438/758 |
| 2010/0035036 A1 | 2/2010 | Mccloy et al. | | |
| 2010/0089096 A1 | 4/2010 | Tamitsuji et al. | | |
| 2011/0244693 A1 | 10/2011 | Tamura et al. | | |
| 2011/0253997 A1 | 10/2011 | Park et al. | | |
| 2014/0099491 A1* | 4/2014 | Ameen | ............... | C23C 14/0021 |
| | | | | 427/535 |
| 2016/0273095 A1* | 9/2016 | Lin | ................... | H01J 37/32467 |

FOREIGN PATENT DOCUMENTS

| | | | | |
|---|---|---|---|---|
| JP | S5911036 A | 1/1984 | | |
| WO | WO-2013052966 A1 * | 4/2013 | ............... | C09D 1/00 |
| WO | 2013191224 A1 | 12/2013 | | |
| WO | 2016131024 A1 | 8/2016 | | |
| WO | 2018132789 A1 | 7/2018 | | |

OTHER PUBLICATIONS

Blockley et al., Aerospace Science and Technology Publishing Engineering 4 Materials Technology, Beijing Institute of Technology Press, pp. 381, 2016.
Dannon, Nano Manufacturing, East China University of Science and Technology Press, pp. 17, 2011.

* cited by examiner

*Primary Examiner* — Tahseen Khan

(57) ABSTRACT

Articles and methods relating to coatings having superior chemical resistance and structural integrity, can be prepared via atomic layer deposition and fluoro-annealing at low process temperatures of between about 150° C. and less than 300° C. The film comprises a fluorinated metal oxide containing yttrium.

5 Claims, 2 Drawing Sheets

ARTICLES COATED WITH A FLUORO-ANNEALED FILM

TECHNICAL FIELD

This disclosure generally relates to semiconductor manufacturing components including a protective fluorinated yttrium metal oxide film and methods of forming a protective fluorinated yttrium metal oxide film on a surface of a semiconductor manufacturing component.

BACKGROUND

Semiconductor manufacturing components need to have high purity, be chemically resistant, and have good temperature stability and structural integrity. Coatings can be applied to various components to prolong the lifetime of the component and to improve purity and temperature stability. However, the coatings themselves require high temperature processing to deposit them. Despite being chemically resistant, the coatings can undergo degradation during use or cleaning and periodic maintenance. Etchant gases, cleaning solutions, and thermal cycling, can shorten the lifetime of the coated component and may also lead to contamination when the components are reinstalled in the manufacturing tool. There is a continuing need for improved coatings for semiconductor manufacturing components.

SUMMARY

This disclosure generally relates to semiconductor manufacturing components including a protective fluorinated yttrium, metal oxide film and methods of forming a protective fluorinated yttrium metal oxide film on a surface of a semiconductor manufacturing component by first depositing a metal oxide film containing yttrium on the surface of the component via atomic layer deposition (ALD) followed by fluoro-annealing the ALD metal oxide film containing yttrium at a low processing temperature to form a protective fluorinated yttrium metal oxide film on the surface of the semiconductor manufacturing component.

According to various embodiments, an article includes a substrate and a protective film overlying at least a portion of the substrate. The article can be a component in a semiconductor manufacturing system, for example, a chamber, chamber component, wafer susceptor, chuck, showerhead, liner, ring, nozzle, baffle, fastener, or wafer transport component, and can be formed from quartz, alumina, aluminum, steel, metal, metal alloy, ceramic or plastics suitable for semiconductor manufacturing. In one embodiment, article can be a reactive-ion etching chamber.

The protective film can be a fluorinated yttrium metal oxide film having a thickness of between 0.01 microns and less than 1 microns. The protective can be fully fluorinated or partially fluorinated. In some embodiments, the film can be yttrium oxyfluoride or yttrium aluminum oxyfluoride.

In some embodiments, the film can be a graded film, with the fluorine content of the film decreasing over a thickness of the film such that the outer portion of the protective film has a higher fluorine content than the inner portion of the film that directly contacts the substrate. For example, in some embodiments, the film can have an outer portion that is yttrium oxyfluoride and an inner portion that is yttria, the fluorine content gradually decreasing from the outer portion to the inner portion. In other embodiments, the film can have an outer portion that is fluorinated yttrium aluminum oxide (i.e., yttrium aluminum oxyfluoride) and an inner portion that is (unfluorinated) yttrium aluminum oxide.

In another embodiment, a method includes depositing a metal oxide containing yttrium onto a surface of a substrate via atomic layer deposition to provide an ALD metal oxide film containing yttrium, and fluoro-annealing the ALD metal oxide film containing yttrium to form a fluorinated metal oxide film containing yttrium.

The fluoro-annealing can be performed at a temperature of about 150° C. to less than about 300° C., and more particularly from a temperature of about 200° C. to 250° C. The fluorination process can be fluorine ion implantation followed by annealing, fluorine plasma processing, fluoropolymer combustion, fluorine gas reaction at an elevated temperature, UV treatment with fluorine gas, or any combination thereof.

The preceding summary is provided to facilitate an understanding of some of the innovative features unique to the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various illustrative embodiments in connection with the accompanying drawings, in which.

Figure 1:
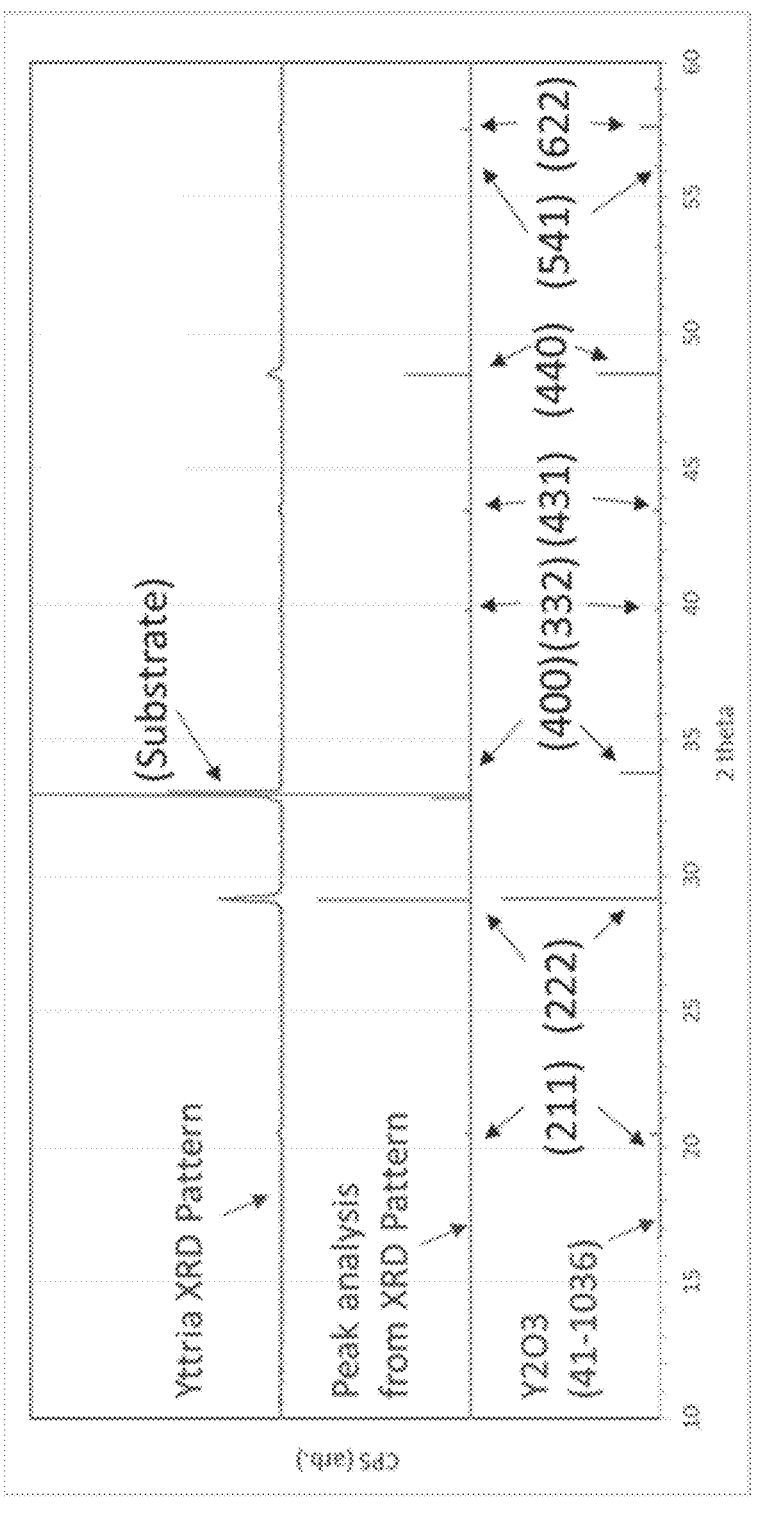
FIG. 1 is an x-ray diffraction (XRD) graph of an atomic layer deposited (ALD) yttria film prior to being subjected to fluoro-annealing in accordance with an embodiment of the disclosure.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DETAILED DESCRIPTION OF THE INVENTION

It must also be noted that as used herein and in the appended claims, the singular forms "a", "an", and "the" include plural reference unless the context clearly dictates otherwise. Thus, for example, reference to a "film" is a reference to one or more films and equivalents thereof known to those skilled in the art, and so forth. Unless defined otherwise, all technical and scientific terms used herein have the same meanings as commonly understood by one of ordinary skill in the art. Methods and materials similar or equivalent to those described herein can be used in the practice or testing of versions of the present invention. All publications mentioned herein are incorporated by reference in their entirety. Nothing herein is to be construed as an admission that the invention is not entitled to antedate such disclosure by virtue of prior invention. "Optional" or "optionally" means that the subsequently described event or circumstance may or may not occur, and that the description includes instances where the event occurs and instances where it does not. All numeric values herein can be modified by the term "about," whether or not explicitly indicated. The term "about" generally refers to a range of numbers that one of skill in the art would consider equivalent to the recited value (i.e., having the same function or result). In some versions the term "about" refers to ±10% of the stated value, in other versions the term "about" refers to ±2% of the stated value. While compositions and methods are described in terms of "comprising" various components or steps (interpreted as meaning "including, but not limited to"), the compositions and methods can also "consist essentially of" or "consist of" the various components and steps, such terminology should be interpreted as defining essentially closed-member groups.

According to various embodiments, an article such as, for example, a component in a semiconductor manufacturing system includes a substrate having a protective film overlying at least a portion of the substrate. The substrate can be a component in a semiconductor manufacturing system, for example, a chamber, chamber component, wafer susceptor, chuck, showerhead, liner, ring, nozzle, baffle, fastener, or wafer transport component, and can be formed from quartz, alumina, aluminum, steel, metal, metal alloy, ceramic or plastics suitable for semiconductor manufacturing. In one embodiment, article can be a reactive ion-etching (RIE) chamber. In other embodiments, the substrate can be a vacuum compatible substrate. In many cases, the protective film can be a fluorinated metal oxide yttrium containing film such as, for example, yttrium oxyfluoride film, fluorinated yttrium aluminum oxide film or an aluminum oxyfluoride film. These are just some examples. The protective film can be fully fluorinated or partially fluorinated.

According to various embodiments, the protective film is formed on a surface of a component by first depositing a metal oxide film containing yttrium on the surface of the component via atomic layer deposition (ALD) followed by fluoro-annealing the ALD metal oxide film containing yttrium at a low processing temperature to form a protective fluorinated yttrium containing metal oxide film on the surface of a semiconductor component such as, for example, a RIE component.

Fluoro-annealed yttrium-containing metal oxide films offer several advantages and have several desirable characteristics, including a high fluorine plasma etch resistance (e.g., about 0.1 to about 0.2 microns/hr), a high wet chemical etch resistance (e.g., about 5 to about 120 minutes in 5% HCl), good adhesion to chamber components (e.g., second critical load (LC2) adhesion of about 5N to about 15N), and conformal coating ability. Additionally, the fluoro-annealed yttrium-containing metal oxide films are tunable in terms of material, mechanical properties, and microstructure. For example, the etch resistance of fluorinated yttria increases with fluorine content in the film. Fluoro-annealed yttrium-containing metal oxide films also offer the additional advantages of superior crack resistance and improved integrity at elevated temperatures versus non-fluorinated yttria films.

Fluoro-annealed yttrium-containing metal oxide films formed via atomic layer deposition (ALD) offer the additional advantages of being crack resistance after thermal cycling at elevated temperatures, and also the ability to be made at lower process temperatures compared to fluoro-annealed films made from PVD deposited metal oxide yttrium containing films. The ability to process the yttrium-containing metal oxide films at low processing temperature prevents cracking by reducing the thermal stress created between the film and the substrate. Lower process temperatures increase the range of substrate materials on which an yttrium-containing metal oxide film may be deposited and then fluorinated by fluoro-annealing as some substrate materials may not be compatible at higher temperatures. In addition, atomic layer deposited fluoro-annealed yttrium-containing metal oxide films can be very thin, highly dense and highly conformal films that are substantially pinhole free.

According to various embodiments of the disclosure, a film of a metal oxide containing yttrium, such as yttria and yttrium aluminum oxide, is first deposited onto a substrate. The deposition of the metal oxide film can occur by atomic layer deposition (ALD), or plasma assisted ALD. The metal oxide containing yttrium coatings can be prepared with the substrate held at a temperature of between 100° C. and 350° C. and in some cases, at a temperature of between 140° C. and 200° C. which is beneficial for temperature sensitive substrates. The thickness of the metal oxide containing yttrium, for example a yttria coating, can range from: about 0.001 microns (1 nm) to less than 1 micron; from about 0.01 microns (10 nm) to less than a 1 micron; from about 0.01 microns (10 nm) to about 0.7 microns; from about 0.01 microns (10 nm) to about 0.5 microns; and in some cases, from about 0.01 microns (10 nm) to 0.25 microns (250 nm).

Following deposition, the film of a metal oxide containing yttrium is fluoro-annealed at a temperature in the range of about 150° C. to less than about 300° C. in an environment containing fluorine. In some cases, the film of a metal oxide containing yttrium is fluoro-annealed at a temperature in the range of: about 150° C. to less than about 300° C.; about 200° C. to less than about 300° C.; about 200° C. to about 275° C.; and more particularly, from about 200° C. to about 250° C. in an environment containing fluorine. The heating ramp rate of the fluoro-annealing process can be between from 50° C. per hour to 200° C. per hour. In some versions the fluoro-annealing process includes introducing fluorine into metal oxide yttrium-containing films by annealing the films from between 200° C. up to, but less than 300° C. in a fluorine containing atmosphere. The fluorination process can be performed by several methods, including, for example, fluorine ion implantation followed by annealing, fluorine plasma processing below 300° C., fluoropolymer combustion methods, fluorine gas reactions at elevated temperatures, and UV treatments with fluorine gas, or any combination of the foregoing.

Various sources of fluorine can be used depending upon the fluoro-annealing method employed. For fluoropolymer combustion methods, fluorine polymer material is needed and can be, for example, PVF (polyvinylfluoride), PVDF (polyvinylidene fluoride), PTFE (polytetrafluoroethylene), PCTFE (polychlorotrifluoroethylene), PFA, MFA (perfluoroalkoxy polymer), FEP (fluorinated ethylene-propylene), ETFE (polyethylenetetrafluoroethylene), ECTFE (polyethylenechlorotrifluoroethylene), FFPM/FFKM (Perfluorinated Elastomer [Perfluoroelastomer]), FPM/FKM (Fluorocarbon [Chlorotrifluoroethylenevinylidene fluoride]), PFPE (Perfluoropolyether), PFSA (Perfluorosulfonic acid), and Perfluoropolyoxetane.

For other fluoro-annealing methods, including fluorine ion implantation followed by annealing, fluorine plasma processing below 300° C., fluorine gas reactions at elevated temperatures, and UV treatments with fluorine gas, fluorinated gases and oxygen gases are needed for reaction. Fluorinated gases can be, for example, hydrofluorocarbons (HFCs), perfluorocarbons (PFCs), sulfur hexafluoride ($SF_6$), HF vapor, NF3, and gas from fluoropolymer combustion.

The yttria or yttrium aluminum oxide film is preferably columnar in structure, such that the structure permits fluorine to penetrate the film through grain boundaries during the fluoro-annealing process. An amorphous yttria structure (i.e., non-columnar, or less-columnar) does not permit fluorine to penetrate as easily during the fluoro-annealing process.

The fluoro-annealed films are tunable, with the fluoro-annealing process allowing for variations in depth and density of the fluorination of the films. In one version of the invention the fluoro-annealed film is completely fluorinated (fully saturated), with fluorine located throughout the depth of the film. In another version of the invention, the fluoro-annealed film is partially fluorinated, with fluorine located along an outer portion of the film but not throughout the entire depth of the film. In addition, the film can be a graded film, with the fluorine content varying over the depth of the film. For example, the top (outermost) portion of the film may include the highest fluorine content, with the fluorine content gradually decreasing over the depth the film toward the bottom (innermost) portion of the film that is closest to and interfaces with the substrate. The outermost portion of the film is that which faces the etching environment.

The film provides a protective layer overlying the substrate, the protective layer being an outermost layer of a coated article that is in contact with the environment inside the semiconductor component such as, for example, the environment inside a vacuum chamber.

Example 1

Fluorination of Atomic Layer Deposition Vapor Deposited yttria

ALD yttria films were prepared on aluminum substrate coupons held at a temperature of between 140° C. and 200° C. during the ALD deposition. The thickness of the yttria film on various coupons was varied between 0.01 microns to less than 1 micron. FIG. 1 shows the x-ray diffraction (XRD) pattern the (ALD) yttria film prior to fluoro-annealing.

The coupons with the ALD yttria films were then fluorinated by fluoro-annealing the coupons in a furnace containing a source of fluorine. The samples were cycled five times in air in the furnace with the fluorine source. Each cycle included a ramp up at 100° C. per hour, a soak at a temperature of 250° C. for 1 hour, a ramp down in temperature at 100° C./hr, and a soak at a temperature of 100° C. for 10 minutes before the next ramp up to 250° C.

Figure 2:
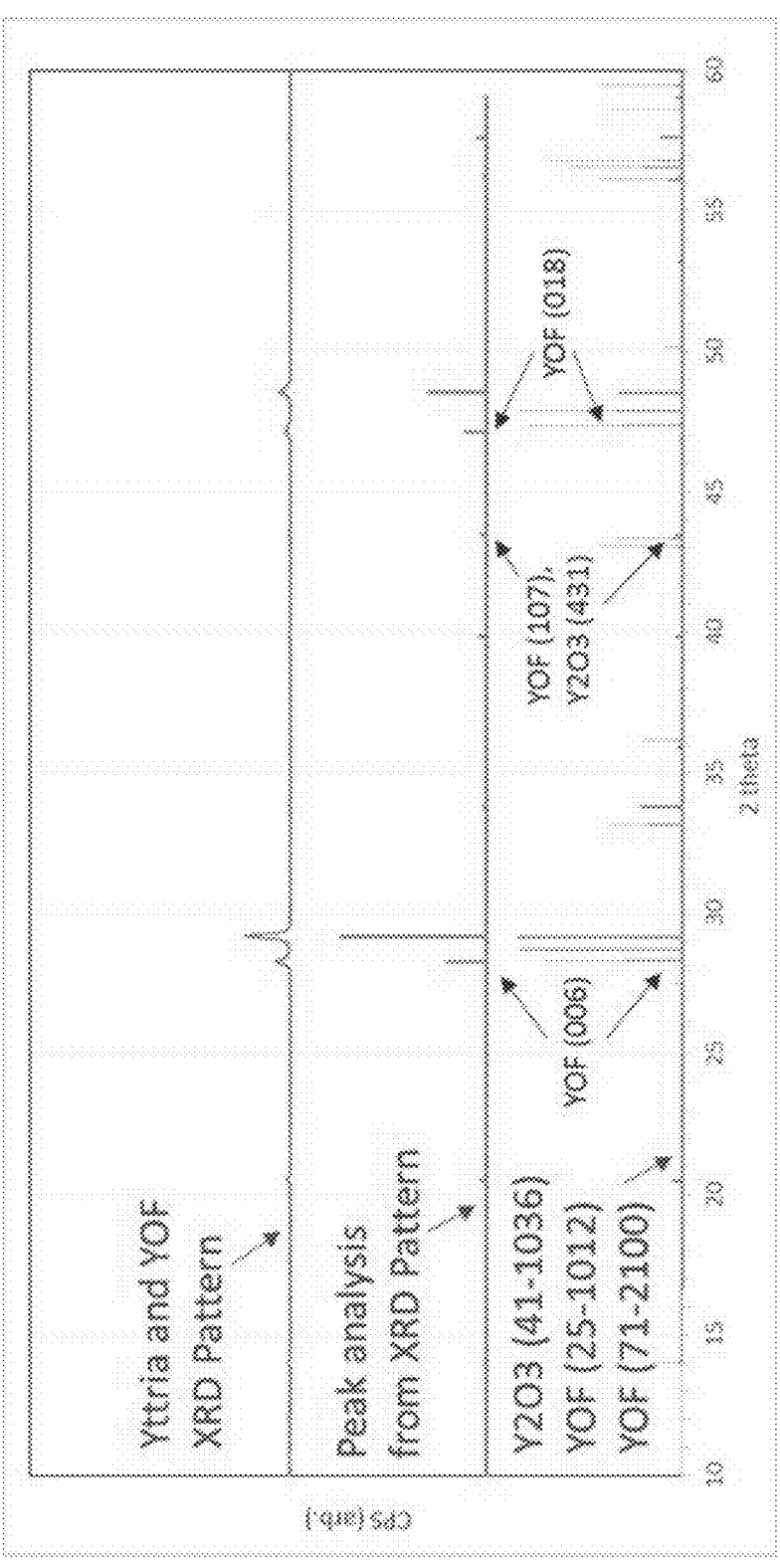
FIG. 2 is an x-ray diffraction (XRD) graph of an atomic layer deposited (ALD) yttria film after fluoro-annealing at lower process temperatures in accordance with an embodiment of the disclosure.

The fluorinated ALD yttria film has superior crack resistance. Thermal cycling between room temperature and 250° C. of control coupons with yttria grown on aluminum without fluorination treatment had yttria film cracking, while fluorinated ALD yttria films as prepared above did not crack under the same thermal cycling. FIG. 2 shows the x-ray diffraction pattern of the atomic layer deposited (ALD) yttria film after fluoro-annealing. The XRD film of the fluoro-annealed ALD film shows that the yttria film becomes a graded film having an outer portion is fluorinated yttrium aluminum oxide (i.e., yttrium aluminum oxyfluoride) and an inner portion that is (unfluorinated) yttrium aluminum oxide.

The results of this example show that crack resistant films containing yttrium and oxygen that are formed by an ALD process can be fluorinated at lower temperatures of between 150° C. and less than 300° C. compared to the higher temperatures like 300° C. to 650° C. used for CVD or PVD deposited yttrium and oxygen containing films. Lower ALD deposition temperatures and lower fluoro-annealing temperatures are advantageous for coating temperature sensitive substrates like polymers and substrates with large CTE (coefficients of thermal expansion) mismatch to film.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respects, only illustrative. Changes may be made to the details, particularly in matters of shape, size, and arrangement of parts without exceeding the scope of the disclosure. The disclosure's scope is, of course, defined in the language in which the appended claims are expressed.

What is claimed is:

1. An article, comprising:
   a substrate;
   a protective film overlying at least a portion of the substrate, the film comprising a fluorinated metal oxide containing yttrium and having a thickness of between 0.001 microns and 0.01 microns, wherein the protective film is crack resistant and pinhole free.

2. The article of claim 1, wherein the protective film is a graded film and wherein a fluorine content of the film decreases over a thickness of the film from an outer portion of the film that contains more fluorine to an inner portion of the film that directly contacts the substrate and that contains less fluorine than the outer portion of the film.

3. The article of claim 1, wherein the substrate is a semiconductor manufacturing component.

4. A method comprising:
   atomic layer depositing a metal oxide containing yttrium onto a substrate, the metal oxide forming a film with a thickness of between 0.001 microns and 0.01 microns overlying the substrate; and subsequently, fluoro-annealing the film at a temperature ranging from 150° C. to 275° C. in a fluorine containing environment, wherein the protective film is crack resistant and pinhole free.

5. The method of claim 4, fluoro-annealing the film at a temperature ranging from 200° C. to about 250° C. in fluorine containing environment.

* * * * *